United States Patent
Kinoshita et al.

(10) Patent No.: US 10,340,063 B2
(45) Date of Patent: Jul. 2, 2019

(54) CHIP RESISTOR AND METHOD FOR MANUFACTURING THE SAME

(71) Applicant: Panasonic Intellectual Property Management Co., Ltd., Osaka (JP)

(72) Inventors: Yasuharu Kinoshita, Fukui (JP); Shoji Hoshitoku, Fukui (JP); Hironori Tsubota, Fukui (JP); Yasuhiro Kashima, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 73 days.

(21) Appl. No.: 15/558,715

(22) PCT Filed: Apr. 26, 2017

(86) PCT No.: PCT/JP2017/016518
§ 371 (c)(1),
(2) Date: Sep. 15, 2017

(87) PCT Pub. No.: WO2017/188307
PCT Pub. Date: Nov. 2, 2017

(65) Prior Publication Data
US 2018/0096759 A1    Apr. 5, 2018

(30) Foreign Application Priority Data

Apr. 27, 2016   (JP) .................. 2016-089333

(51) Int. Cl.
*H01C 1/142* (2006.01)
*H01C 17/28* (2006.01)
*H01L 49/02* (2006.01)

(52) U.S. Cl.
CPC ............. *H01C 1/142* (2013.01); *H01C 17/28* (2013.01); *H01L 28/20* (2013.01)

(58) Field of Classification Search
CPC ........ H01C 1/142; H01C 13/00; H01C 17/28; H01L 28/20; G01R 15/00
(Continued)

(56) References Cited

U.S. PATENT DOCUMENTS

| 6,013,381 A * | 1/2000 | Bobbio | B23K 1/203 257/E21.511 |
| 2005/0225424 A1* | 10/2005 | Tsukada | H01C 1/142 338/309 |
| 2016/0172083 A1* | 6/2016 | Kim | H01C 7/003 338/307 |

FOREIGN PATENT DOCUMENTS

JP    2010-161401    7/2010

OTHER PUBLICATIONS

International Search Report of PCT application No. PCT/JP2017/016518 dated Jul. 18, 2017.

* cited by examiner

Primary Examiner — Dzung Tran
(74) Attorney, Agent, or Firm — McDermott Will & Emery LLP

(57) ABSTRACT

A chip resistor includes a resistive element, first and second electrodes disposed on a lower surface the resistive element, a protective film disposed on the lower surface of the resistive element and between the first and second electrodes. The resistive element has first and second recesses therein. The first recess extends from the lower surface along a first edge surface and does not reach an upper surface of the resistive element. The second recess extends from the lower surface along a second edge surface and does not reach the upper surface of the resistive element. The first and second electrodes are disposed between the first and second recesses. The protective film is disposed between the first and second electrodes. A first plating layer disposed on the
(Continued)

first electrode and an inner surface of the first recess. A second plating layer is disposed on the second electrode and an inner surface of the second recess. This chip resistor avoids mounting failures.

17 Claims, 9 Drawing Sheets

(58) Field of Classification Search
 USPC .......................................................... 257/536
 See application file for complete search history.

US 10,340,063 B2

CHIP RESISTOR AND METHOD FOR MANUFACTURING THE SAME

This application is a U.S. national stage application of the PCT international application No. PCT/JP2017/016518 filed on Apr. 26, 2017, which claims the benefit of foreign priority of Japanese patent application No. 2016-089333 filed on Apr. 27, 2016, the contents all of which are incorporated herein by reference.

TECHNICAL FIELD

The present invention relates to a chip resistor including a resistive element made of a metal plate, and a method for fabricating the chip resistor.

BACKGROUND ART

FIG. 9 is a cross-sectional view of conventional chip resistor 500. Chip resistor 500 includes resistive element 1 made of a metal having a plate shape, electrodes 2a and 2b disposed on both ends of a lower surface of resistive element 1, protective film 3 formed between electrodes 2a and 2b on the lower surface of resistive element 1, and plating layer 4 formed on electrodes 2a and 2b. While mounting chip resistor 500 is mounted onto mounting board 6, solder layer 5 formed on mounting board 6 by plating is formed on plating layer 4.

A conventional resistor similar to chip resistor 500 is disclosed in, e.g. PTL 1.

CITATION LIST

Patent Literature

PTL 1: Japanese Patent Laid-Open Publication No. 2010-161401

SUMMARY

A chip resistor includes a resistive element, first and second electrodes disposed on a lower surface of the resistive element, a protective film disposed on the lower surface of the resistive element and between the first and second electrodes. The resistive element has first and second recesses therein. The first recess extends from the lower surface along a first edge surface and does not reach an upper surface of the resistive element. The second recess extends from the lower surface along a second edge surface and does not reach the upper surface of the resistive element. The first and second electrodes are disposed between the first and second recesses. The protective film is disposed between the first and second electrodes. A first plating layer disposed on the first electrode and an inner surface of the first recess. A second plating layer is disposed on the second electrode and an inner surface of the second recess.

This chip resistor avoids mounting failures.

DETAIL DESCRIPTION OF EMBODIMENTS

Exemplary Embodiment 1

Figure 1A:
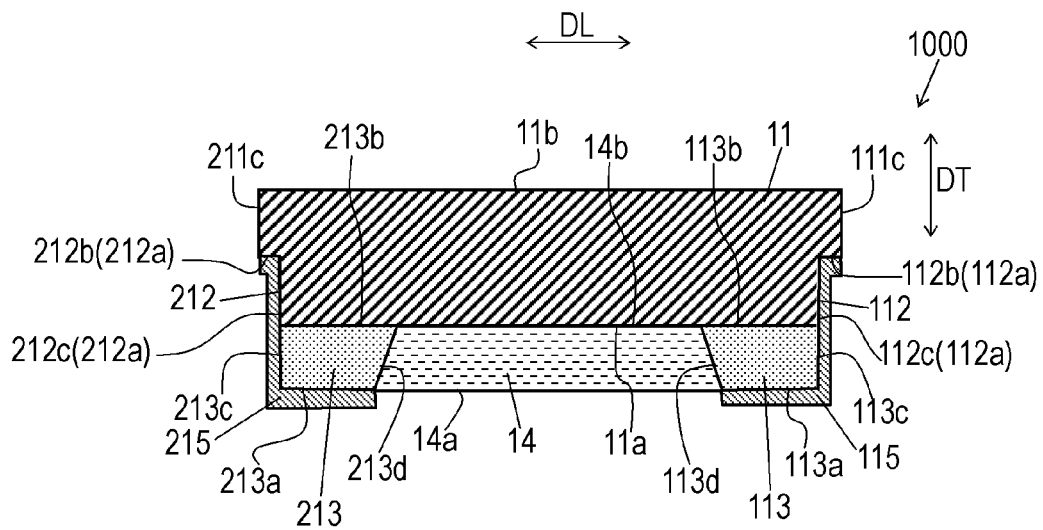
FIG. 1A is a cross-sectional view of a chip resistor according to Exemplary Embodiment 1.

FIG. 1A is a cross-sectional view of chip resistor 1000 according to Exemplary Embodiment 1. Chip resistor 1000 includes resistive element 11 having a plate shape, a pair of recesses 112 and 212 that are formed at both ends of lower surface 11a of resistive element 11 and do not pass through resistive element 11, a pair of electrodes 113 and 213 formed on lower surface 11a of resistive element 11 and between recesses 112 and 212, and protective film 14 formed on lower surface 11a of resistive element 11 and between electrodes 113 and 213.

Resistive element 11 has a plate shape having upper surface 11b, lower surface 11a, edge surface 111c, and edge surface 211c. Edge surface 111c is connected to upper surface 11b and lower surface 11a. Edge surface 211c is connected to upper surface 11b and lower surface 11a, and is opposite to edge surface 111c. Resistive element 11 has recesses 112 and 212 provided therein.

Electrode 113 has upper surface 113b, lower surface 113a, edge surface 113d, and edge surface 113c. Upper surface 113b is disposed on lower surface 11a of resistive element 11. Edge surface 113d is connected to upper surface 113b and lower surface 113a. Edge surface 113c is connected to upper surface 113b and lower surface 113a, and is opposite to edge surface 113d. Electrode 213 has upper surface 213b, lower surface 213a, edge surface 213d, and edge surface 213c. Upper surface 213b is disposed on lower surface 11a of resistive element 11. Edge surface 213d is connected to upper surface 213b and lower surface 213a. Edge surface 213c is connected to upper surface 213b and lower surface 213a, and is opposite to edge surface 213d.

Plating layer 115 is formed on inner surface 112a of recess 112, edge surface 113c of electrode 113, and lower surface 113a of electrode 113 which are exposed from protective film 14. Plating layer 215 is formed on inner surface 212a of recess 212, edge surface 213c of electrode 213, and lower surface 213a of electrode 213 which are exposed from protective film 14.

Resistive element 11 is made of metal, such as NiCr, CuNi, or CuMn. Upper surface 11b and lower surface 11a of resistive element 11 are arranged in thickness direction DT with a distance between surfaces 11a and 11b. Edge surfaces 111c and 211c are arranged in longitudinal direction DL with a distance between edge surfaces 111c and 211c. Resistive element 11 may have a slit therein to adjust a resistance value of resistive element 11. This slit does not necessarily pass through resistive element 11.

Recesses 112 and 212 are disposed in lower surface 11a of resistive element 11 at both ends of lower surface 11a of resistive element 11 in longitudinal direction DL, and do not reach upper surface 11b of resistive element 11. That is, recess 112 extends from lower surface 11a along edge surface 111c and does not reach upper surface 11b. Recess 212 extends from lower surface 11a along edge surface 211c and does not reach upper surface 11b. Recess 112 has inner side surface 112c and bottom surface 112b connected to inner side surface 112c and edge surface 111c of resistive element 11. Inner side surface 112c and bottom surface 112b constitute inner surface 112a of recess 112. Recess 212 has inner side surface 212c and bottom surface 212b connected to inner side surface 212c and edge surface 211c of resistive element 11. Inner side surface 212c and bottom surface 212b constitute inner surface 212a of recess 212. In accordance with Embodiment 1, bottom surfaces 112b and 212b of recesses 112 and 212 are substantially parallel to lower surface 11a of resistive element 11, while inner side surfaces 112c and 212c are substantially perpendicular to lower surface 11a of resistive element 11. A length of each of recesses 112 and 212 in thickness direction DT, which is the depth of each of recesses 112 and 212, ranges from about ⅓ to ⅔ the length of resistive element 11 in thickness direction DT.

Electrodes 113 and 213 are formed by plating or printing copper on lower surface 11a of resistive element 11, and are spaced from each other on lower surface 11a of resistive element 11 with a predetermined interval. In accordance with Embodiment 1, edge surfaces 113c and 213c of electrodes 113 and 213 are substantially flush with inner side surfaces 112c and 212c of recesses 112 and 212, respectively.

Protective film 14 is made of an insulating material, such as an epoxy resin, and is formed between electrodes 113 and 213 and on lower surface 11a of resistive element 11. Protective film 14 has upper surface 14b disposed on lower surface 11a of resistive element 11 and lower surface 14a. Lower surface 14a of protective film 14 is substantially flush with lower surfaces 113a and 213a of electrodes 113 and 213. Protective film 14 contacts edge surfaces 113d and 213d of electrodes 113 and 213 so as to entirely cover a portion of lower surface 11a of resistive element 11 extending from electrode 113 to electrode 213.

Figure 1B:
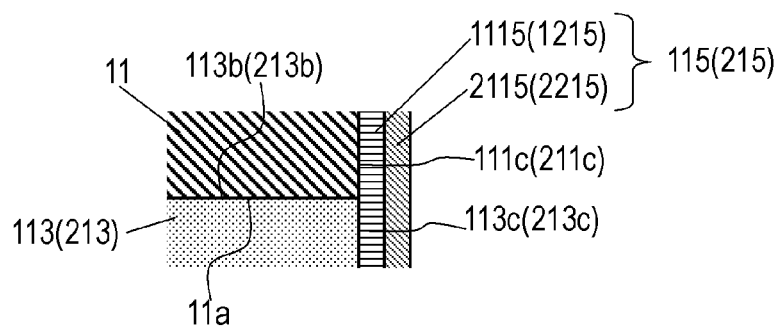
FIG. 1B is an enlarged cross-sectional view of the chip resistor according to Embodiment 1.

FIG. 1B is an enlarged cross-sectional view of chip resistor 1000, and mainly illustrates plating layers 115 and 215. Plating layer 115 includes Ni plating layer 1115 made of Ni and Sn plating layer 2115 made of Sn. Ni plating layer 1115 is disposed on inner surface 112a of recess 112 and edge surface 113c and lower surface 113a of electrode 113. Sn plating layer 2115 is disposed on Ni plating layer 1115. Ni plating layer 1115 and Sn plating layer 2115 are formed in this order. Similarly, plating layer 215 includes Ni plating layer 1215 made of Ni and Sn plating layers 2215 made of Sn. Ni plating layer 1215 is disposed on inner surface 212a of recess 212 and edge surface 213c and lower surface 213a of electrode 213. Sn plating layers 2215 is disposed on Ni plating layer 1215. Ni plating layer 1215 and Sn plating layer 2215 are formed in this order. That is, plating layers 115 and 215 are formed on portions of chip resistor 1000 exposed downward from protective film 14.

Figure 1C:
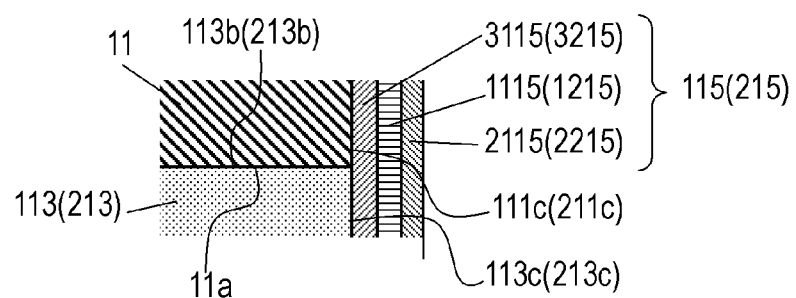
FIG. 1C is an enlarged cross-sectional view of another chip resistor according to Embodiment 1.

FIG. 1C is an enlarged cross-sectional view of another chip resistor 1000, and mainly illustrates plating layers 115 and 215. In FIG. 1C, components identical to those of plating layers 115 and 215 illustrated in FIG. 1B are denoted by the same reference numerals. Plating layer 115 illustrated in FIG. 1C includes Cu plating layer 3115 made of Cu, Ni plating layer 1115 made of Ni, and Sn plating layer 2115 made of Sn. Cu plating layer 3115 is disposed on inner surface 112a of recess 112 and edge surface 113c and lower surface 113a of electrode 113. Ni plating layer 1115 is disposed on Cu plating layer 3115. Sn plating layer 2115 is disposed on Ni plating layer 1115. Cu plating layer 3115, Ni plating layer 1115, and Sn plating layer 2115 are formed in this order. Similarly, plating layer 215 illustrated in FIG. 1C includes Cu plating layer 3215 made of Cu, Ni plating layer 1215 made of Ni, and Sn plating layers 2215 made of Sn. Cu plating layer 3215 is disposed on inner surface 212a of recess 212 and edge surface 213c and lower surface 213a of electrode 213. Ni plating layer 1215 is disposed on Cu plating layer 3215. Sn plating layers 2215 is disposed on Ni plating layer 1215. Cu plating layer 3215, Ni plating layer 1215, and Sn plating layers 2215 are formed in this order.

Figure 2:
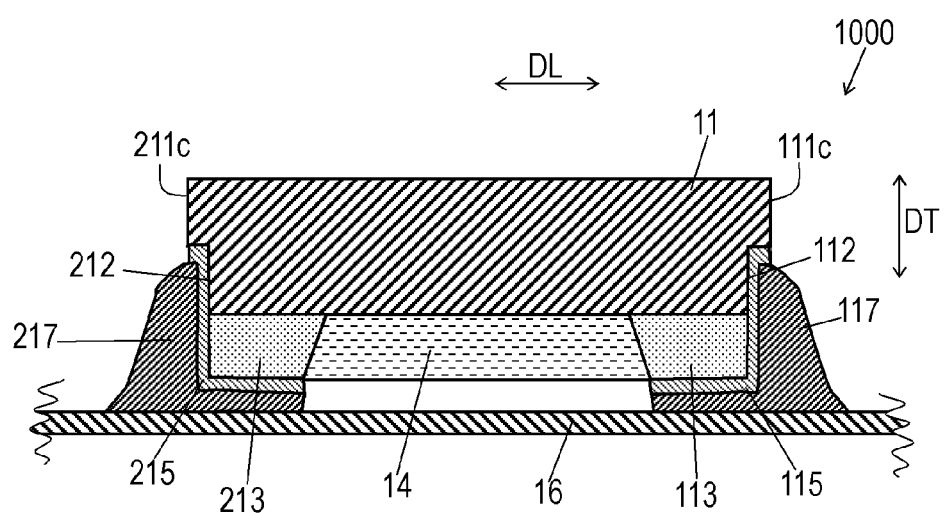
FIG. 2 is a cross-sectional view of the chip resistor according to Embodiment 1 mounted onto a mounting board.

FIG. 2 is a cross-sectional view of chip resistor 1000 mounted onto mounting board 16. Chip resistor 1000 is mounted onto mounting board 16 while lands of mounting board 16 are connected to plating layers 115 and 215 via mounting solder layers 117 and 217, respectively.

Solder layer 117 is formed both on a portion of plating layer 115 parallel to lower surface 11a of resistive element 11 and on a portion of plating layer 115 perpendicular to lower surface 11a. Similarly, solder layer 217 is formed both on a portion of plating layer 215 parallel to lower surface 11a of resistive element 11 and on a portion of plating layer 215 perpendicular to lower surface 11a.

Figure 3A:
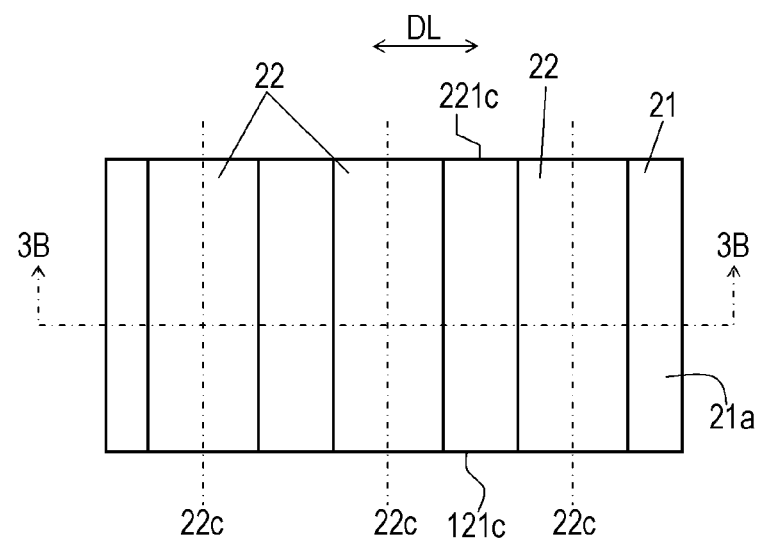
FIG. 3A is a plan view of the chip resistor according to Embodiment 1 for illustrating a method for manufacturing the chip resistor.
Figure 3B:
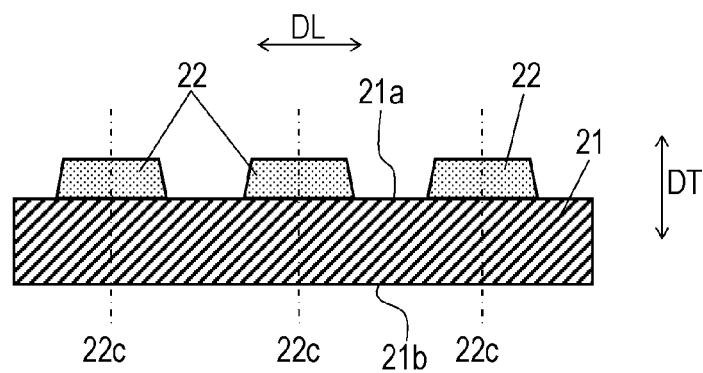
FIG. 3B is a cross-sectional view of the chip resistor along line 3B-3B shown in FIG. 3A.
Figure 4A:
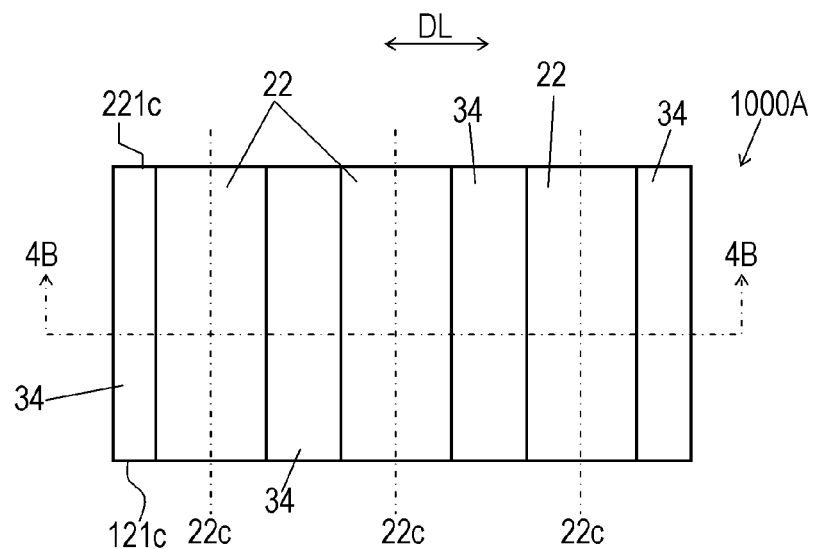
FIG. 4A is a plan view of the chip resistor according to Embodiment 1 for illustrating the method for manufacturing the chip resistor.
Figure 4B:
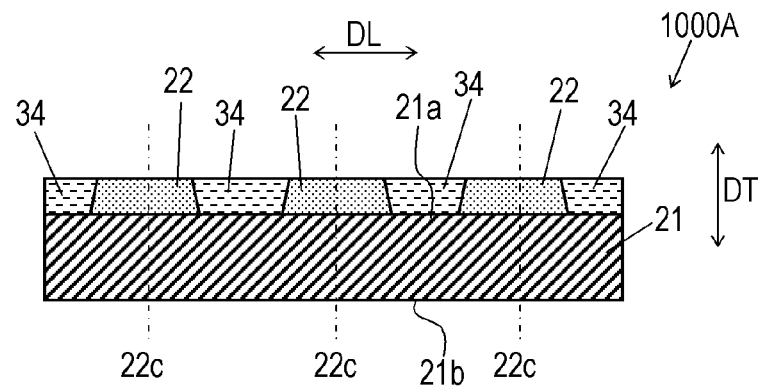
FIG. 4B is a cross-sectional view of the chip resistor along line 4B-4B shown in FIG. 4A.
Figure 4C:
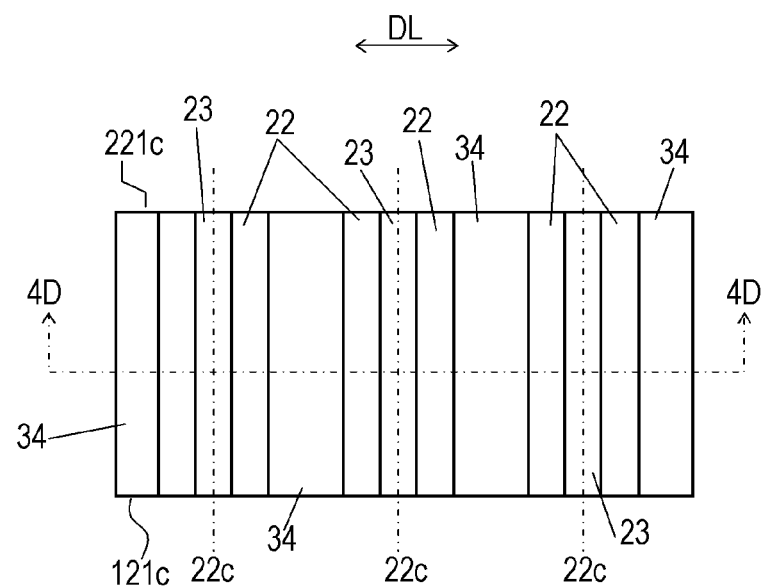
FIG. 4C is a plan view of the chip resistor according to Embodiment 1 for illustrating the method for manufacturing the chip resistor.
Figure 4D:
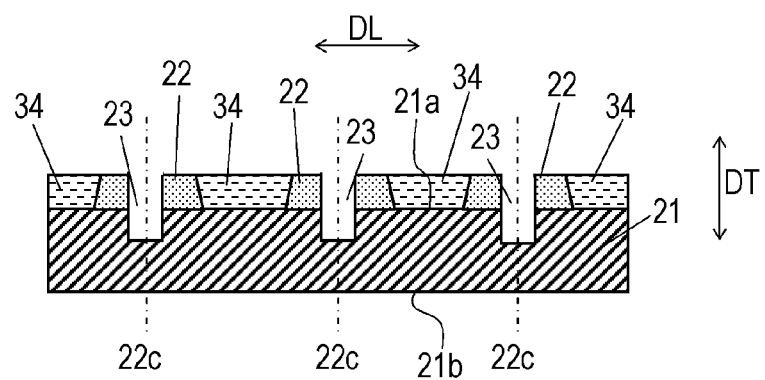
FIG. 4D is a cross-sectional view of the chip resistor along line 4D-4D shown in FIG. 4C.
Figure 5A:
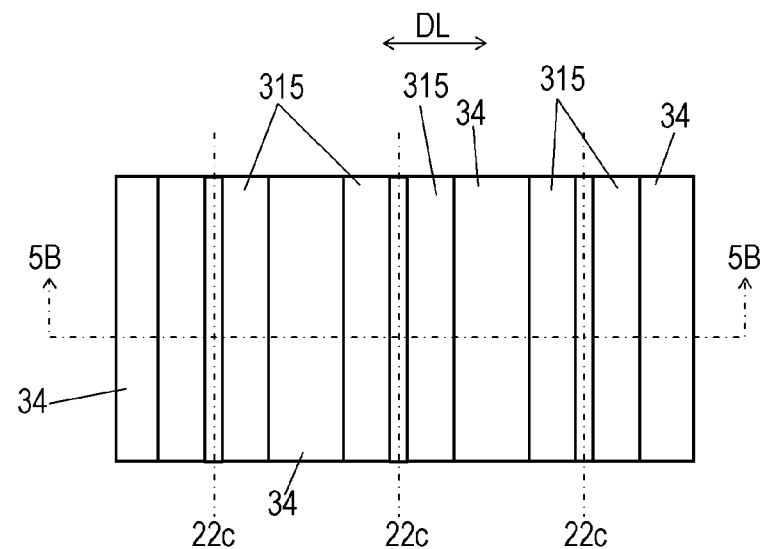
FIG. 5A is a plan view of the chip resistor according to Embodiment 1 for illustrating the method for manufacturing the chip resistor.
Figure 5B:
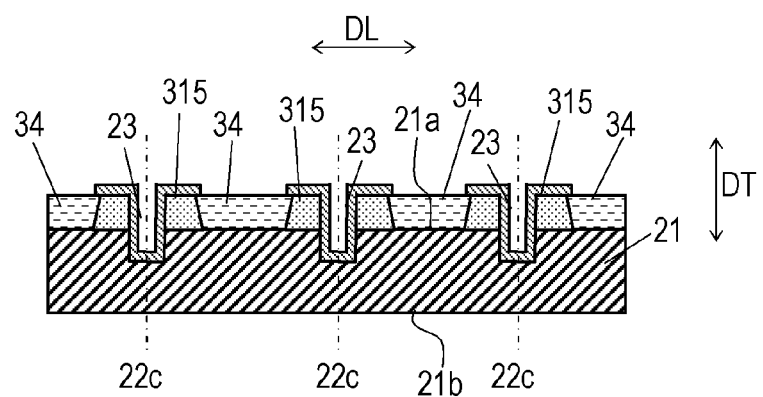
FIG. 5B is a cross-sectional view of the chip resistor along line 5B-5B shown in FIG. 5A.
Figure 5C:
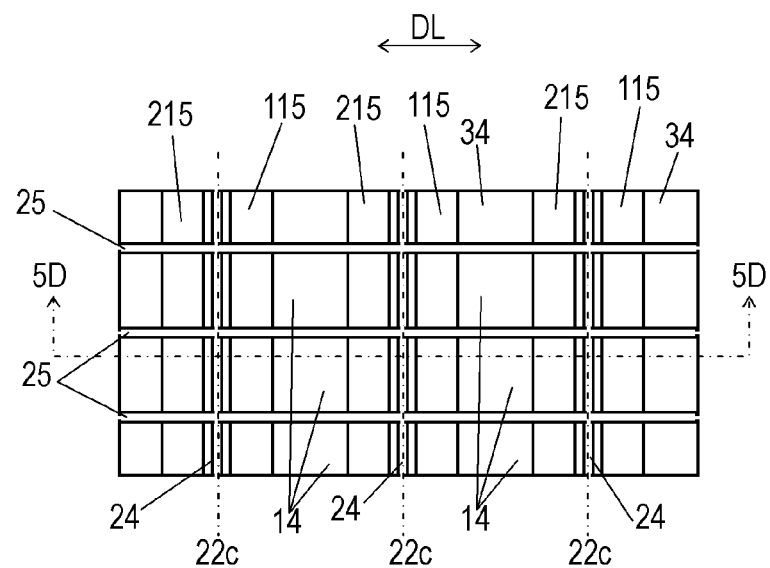
FIG. 5C is a plan view of the chip resistor according to Embodiment 1 for illustrating the method for manufacturing the chip resistor.
Figure 5D:
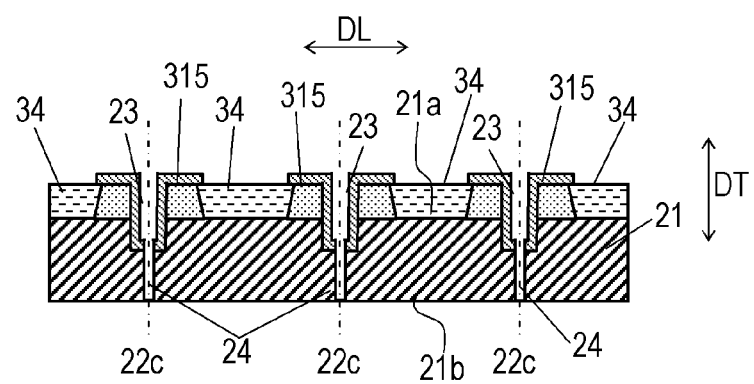
FIG. 5D is a cross-sectional view of the chip resistor along line 5D-5D shown in FIG. 5C.

A method for manufacturing chip resistor 1000 will be described below with reference to drawings. FIG. 3A is a plan view of the chip resistor according to Embodiment 1 for illustrating the method for manufacturing the chip resistor. FIG. 3B is a cross-sectional view of the chip resistor along line 3B-3B shown in FIG. 3A. FIG. 4A is a plan view of the chip resistor according to Embodiment 1 for illustrating the method for manufacturing the chip resistor. FIG. 4B is a cross-sectional view of the chip resistor along line 4B-4B shown in FIG. 4A. FIG. 4C is a plan view of the chip resistor according to Embodiment 1 for illustrating the method for manufacturing the chip resistor. FIG. 4D is a cross-sectional view of the chip resistor along line 4D-4D shown in FIG. 4C. FIG. 5A is a plan view of the chip resistor according to Embodiment 1 for illustrating the method for manufacturing the chip resistor. FIG. 5B is a cross-sectional view of the chip resistor along line 5B-5B shown in FIG. 5A. FIG. 5C is a plan view of the chip resistor according to Embodiment 1 for illustrating the method for manufacturing the chip resistor. FIG. 5D is a cross-sectional view of the chip resistor along line 5D-5D shown in FIG. 5C.

First, as illustrated in FIGS. 3A and 3B, resistive sheet 21 made of a metal, such as NiCr, CuNi, or CuMn, having a plate shape is prepared. Resistive sheet 21 has surface 21*a*, surface 21*b* opposite to surface 21*a*, edge surface 121*c*, and edge surface 221*c*. Edge surface 121*c* is connected to surfaces 21*a* and 21*b*. Edge surface 221*c* is connected to surfaces 21*a* and 21*b*, and is opposite to edge surface 121*c*. Surface 21*b* of resistive sheet 21 constitutes upper surface 11*b* of resistive element 11, while surface 21*a* constitutes lower surface 11*a* of resistive element 11. Paste mainly containing Cu is printed or plated on surface 21*a* of resistive sheet 21 in strip shapes at predetermined intervals, thereby forming strip electrode layers 22 on surface 21*a* of resistive sheet 21. Center line 22*c* of each of strip electrode layers 22 corresponds to an edge surface of s single piece of chip resistor 1000. Resistive sheet 21 is divided into pieces constituting resistive elements 11, while strip electrode layers 22 constitute pairs of electrodes 113 and 213.

Strip electrode layers 22 continuously extend from edge surface 121*c* to edge surface 221*c* of resistive sheet 21.

Next, as illustrated in FIGS. 4A and 4B, an insulating material, such as an epoxy resin, is applied onto portions of surface 21*a* of resistive sheet 21 between strip electrode layers 22 and is dried, thereby forming protective film 34 constituting protective film 14. The surface of protective film 34 and the surfaces of electrode layers 22 are substantially flush with each other. Resistive sheet 21 having surfaces 21*a* and 21*b*, electrode layers 22 separated from each other on surface 21*a* of resistive sheet 21, and protective film 34 provided on surface 21*a* of resistive sheet 21 between electrode layers 22 constitute layered body 1000A.

Then, as illustrated in FIGS. 4C and 4D, grooves 23 having straight shapes are formed by dicing along center lines 22*c* of strip electrode layers 22. Grooves 23 completely pass through strip electrode layers 22 but do not completely pass through resistive sheet 21 to extend halfway in thickness direction DT. That is, grooves 23 enter into surface 21*a* of resistive sheet 21 but do not reach surface 21*b*. Grooves 23 constitute recesses 112 and 212.

Subsequently, as illustrated in FIGS. 5A and 5B, an Ni plating layer and an Sn plating layer are formed in this order on surfaces of strip electrode layers 22, that is, a portion of strip electrode layers 22 exposed from protective film 14 and inner surfaces of grooves 23, thereby providing plating layer 315. Plating layer 315 is thus formed continuously on inner surfaces 112*a* and 212*a* of recesses 112 and 212, edge surfaces 113*c* and 213*c* of electrodes 113 and 213, and lower surfaces 113*a* and 213*a* of electrodes 113 and 213.

Then, as illustrated in FIGS. 5C and 5D, dicing or laser application is performed from grooves 23 or on surface 21*a* of resistive sheet 21, thereby forming grooves 24 in surface 21*b* of resistive sheet 21. Grooves 24 are narrower than grooves 23, and overlap grooves 23 in a plan view. Since grooves 23 are formed before forming grooves 24, grooves 24 can be easily positioned.

Even if grooves 24 are deviated a little, as long as respective distances between pairs of grooves 24 adjacent to each other are identical to one another, resistive elements 11 obtained by dividing resistive sheet 21 have the same length, thus reducing variations in resistance values of the resistive elements. Since grooves 24 are narrower than grooves 23, plating layers 115 and 215 can remain on bottom surfaces 112*b* and 212*b* of recesses 112 and 212, as illustrated in FIG. 1A.

Resistive sheet 21, electrode layers 22, protective film 34, and plating layer 315 are divided at grooves 24 and division grooves 25 perpendicular to grooves 24 so that resistive sheet 21 can be divided into pieces each constituting chip resistor 1000 illustrated in FIG. 1A. Then, the resistance value of chip resistor 1000 may be adjusted with the slits described above.

To simplify the description, in FIGS. 3A to 5D, chip resistors 1000 as individual pieces are arranged in a matrix constituted by two columns and two rows.

Figure 9:
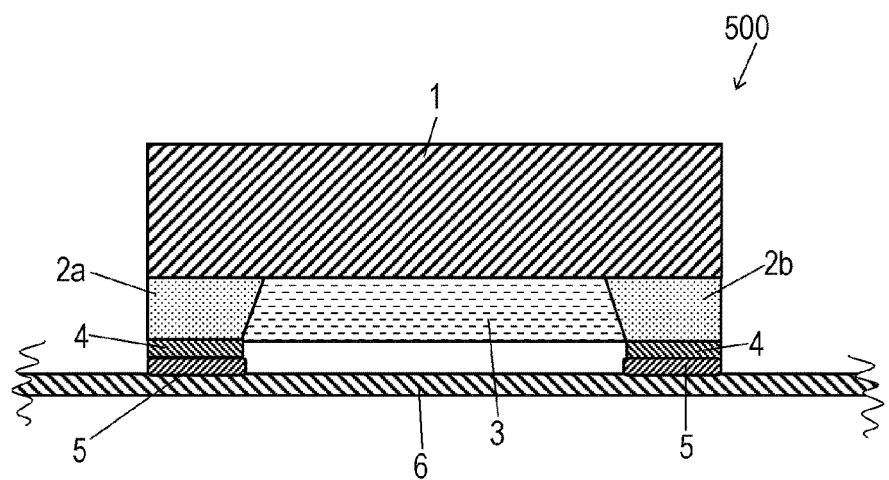
FIG. 9 is a cross-sectional view of a conventional chip resistor.

In conventional chip resistor 500 illustrated in FIG. 9, when mounting board 6 warps, a stress in upward and downward directions is concentrated on end portions of solder layer 5 and may produce cracks in solder layer 5, thus raising a failure in mounting.

In chip resistor 1000 according to Embodiment 1, recesses 112 and 212 which do not pass through provided at both ends of lower surface 11*a* of resistive element 11 have inner side surfaces 112*c* and 212*c* perpendicular to lower surface 11*a* of resistive element 11. When mounting board 16 warps, a stress in thickness direction DT is applied to solder layers 117 and 217. Since solder layers 117 and 217 are formed on inner side surfaces 112*c* and 212*c*, the direction of the stress applied to solder layers 117 and 217 is parallel to inner side surfaces 112*c* and 212*c* perpendicular to lower surface 11*a* of resistive element 11. Thus, the stress on solder layers 117 and 217 can be reduced so that cracking in solder layers 117 and 217 can be reduced, thereby reducing occurrence of mounting failures. As a result, the resistance value of chip resistor 1000 can be stabilized.

Recesses 112 and 212 serve as spaces in mounting chip resistor 1000, and increase contact areas between mounting solder layers 117 and 217 and plating layers 115 and 215, accordingly increasing a mounting strength.

Figure 6:
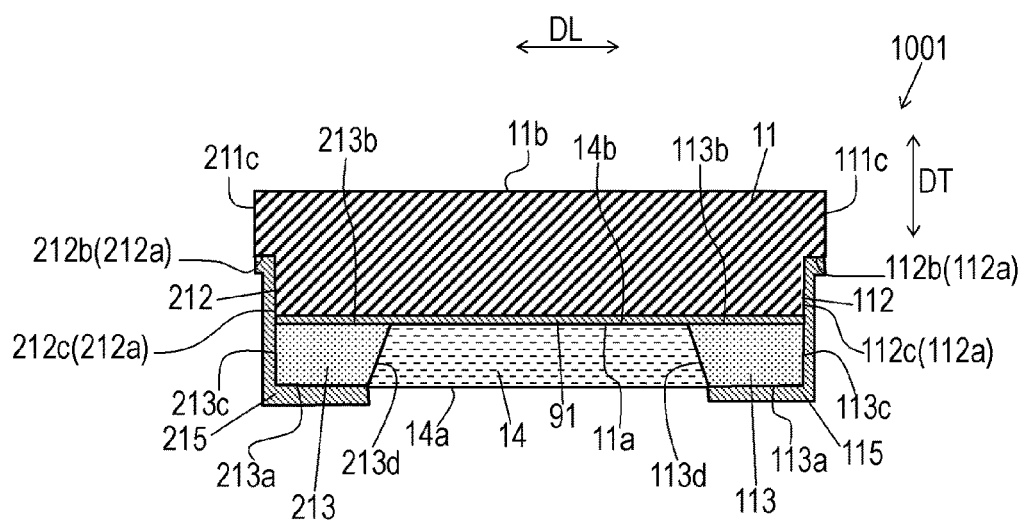
FIG. 6 is a cross-sectional view of another chip resistor according to Embodiment 1.

FIG. 6 is a cross-sectional view of another chip resistor 1001 according to Embodiment 1. In FIG. 6, components identical to those of chip resistor 1000 illustrated in FIG. 1A are denoted by the same reference numerals. Chip resistor 1001 illustrated in FIG. 6 includes metal layer 91 made of CuNi and disposed on lower surface 11*a* of resistive element 11. Metal layer 91 contacts electrodes 113 and 213 and protective film 14. Metal layer 91 reduces a temperature coefficient of resistance (TCR) of chip resistor 1001.

Exemplary Embodiment 2

Figure 7:
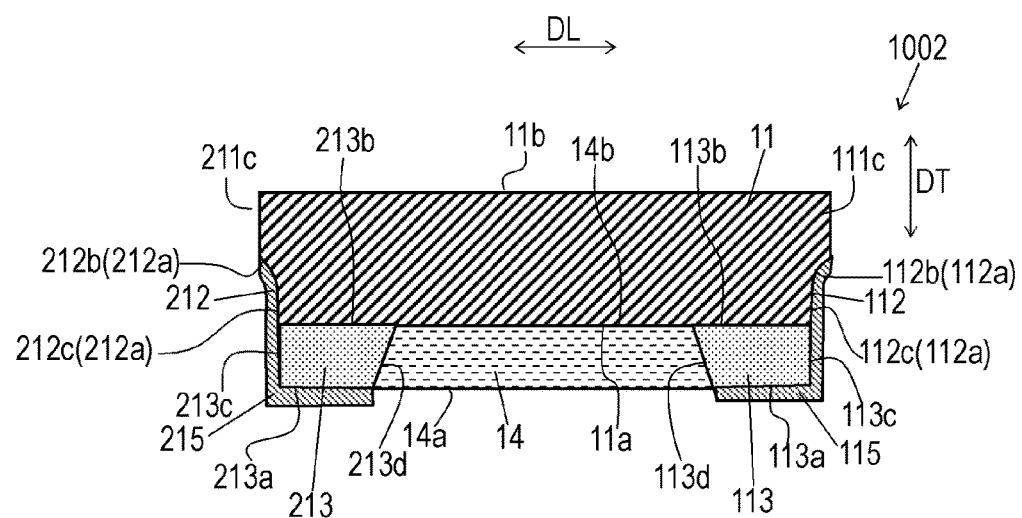
FIG. 7 is a cross-sectional view of a chip resistor according to Exemplary Embodiment 2.

FIG. 7 is a cross-sectional view of chip resistor 1002 according to Exemplary Embodiment 2. In FIG. 7, components identical to those of chip resistor 1000 according to Embodiment 1 illustrated in FIGS. 1A to 5D are denoted by the same reference numerals.

In chip resistor 1002 according to Embodiment 2, cross sections of inner surfaces 112*a* and 212*a* of recesses 112 and 212 have arcuately concave portions, unlike resistor 1000 (1001) according to Embodiment 1.

The cross sections of inner surfaces 112*a* and 212*a* may be entirely arcuate or may be partially arcuate, or the cross sections of inner surfaces 112*a* and 212*a* may be linear. Portions of inner surfaces 112*a* and 212*a* connected to edge surfaces 111*c* and 211*c* of resistive element 11, that is, bottom surfaces 112*b* and 212*b*, preferably have arcuate cross sections. In this case, end portions of plating layers 115 and 215 connected to edge surfaces 111*c* and 211*c* of resistive element 11 may be arcuate.

This configuration can disperse a stress applied to end portions of plating layers 115 and 215 contacting edge surfaces 111c and 211c of resistive element 11, thereby increasing mounting strength.

Exemplary Embodiment 3

Figure 8:
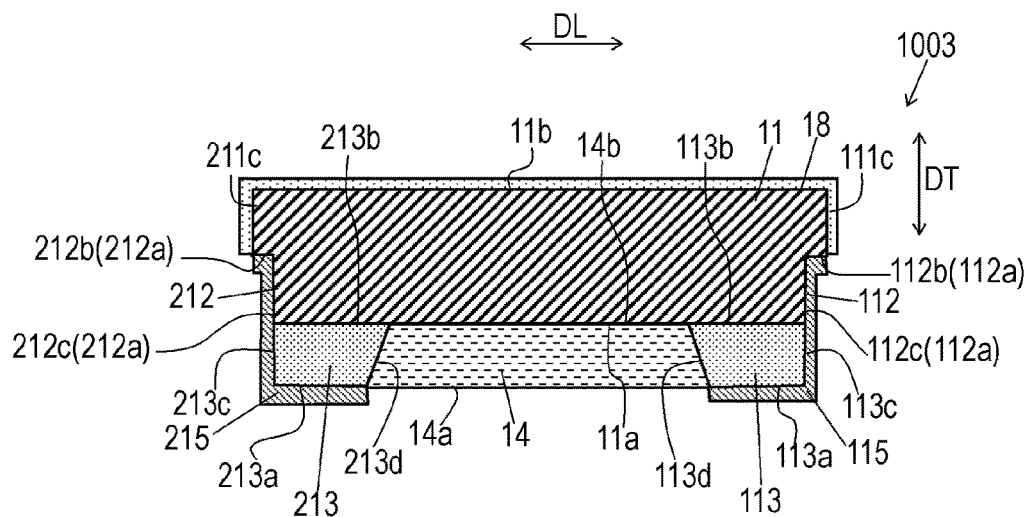
FIG. 8 is a cross-sectional view of a chip resistor according to Exemplary Embodiment 3.

FIG. 8 is a cross-sectional view of chip resistor 1003 according to Exemplary Embodiment 3. In FIG. 8, components identical to those of chip resistor 1000 according to Embodiment 1 illustrated in FIGS. 1A to 5D are denoted by the same reference numerals.

Chip resistor 1003 according to Embodiment 3 further includes fluorine-based coating layer 18 disposed on an exposed surface of resistive element 11 of chip resistor 1000 according to Embodiment 1. In accordance with Embodiment 3, fluorine-based coating layer 18 is formed on upper surface 11b and edge surfaces 111c and 211c of resistive element 11.

Fluorine-based coating layer 18 is made of an anti-flux agent mainly containing fluorine, and repels flux contained in solder layers 117 and 217 due to a repelling effect of fluorine. Thus, solder layers 117 and 217 are not formed on portions where fluorine-based coating layer 18 is formed.

Fluorine-based coating layer 18 formed on edge surfaces 111c and 211c of resistive element 11 prevents solder layers 117 and 217 from extending onto edge surfaces 111c and 211c of resistive element 11.

A portion of the chip resistor between solder layer 117 and edge surface 111c and a portion of the chip resistor between solder layer 217 and edge surface 211c are vulnerable to a stress in thickness direction DT applied to solder layers 117 and 217 due to the warpage of mounting board 16. In the case that solder layers 117 and 217 extend to edge surfaces 111c and 211c, a failure in mounting the chip resistor might occur. In chip resistor 1003 according to Embodiment 3, fluorine-based coating layer 18 prevents solder layers 117 and 217 from extending to edge surfaces 111c and 211c of resistive element 11, thus preventing mounting failures.

Fluorine-based coating layer 18 formed on upper surface 11b of resistive element 11 prevents solder layers 117 and 217 from extending to upper surface 11b of resistive element 11.

In the case that solder layers 117 and 217 extend to upper surface 11b, solder layers 117 and 217 increases the height of a product including the chip resistor according to the thickness of the extending portions of solder layers 117 and 217. Fluorine-based coating layer 18 formed on upper surface 11b of resistive element 11 prevents solder layers 117 and 217 from extending to upper surface 11b of resistive element 11, hence reducing that the height of a product including chip resistor 1003.

In Embodiments 1 to 3, terms, such as "upper surface" and "lower surface", indicating directions indicate relative directions depending only on relative positional relationships among components, such as resistive element 11 and electrodes 113 and 213, of the chip resistor, and do not indicate absolute directions, such as a vertical direction.

REFERENCE MARKS IN THE DRAWINGS 11 resistive element
14 protective film
18 fluorine-based coating layer
21 resistive sheet
22 electrode layer (first electrode layer, second electrode layer)
23 groove (first groove, second groove)
24 groove (third groove, fourth groove)
112 recess (first recess)
113 electrode (first electrode)
115 plating layer (first plating layer)
212 recess (second recess)
213 electrode (second electrode)
215 plating layer (second plating layer)
315 plating layer (first plating layer, second plating layer)
1000A layered body

The invention claimed is:

1. A chip resistor comprising:
a resistive element made of a metal having a plate shape having an upper surface, a lowermost surface, a first edge surface connected to the upper surface and the lowermost surface, and a second edge surface connected to the upper surface and the lower surface, the second edge surface being opposite to the first edge surface, the resistive element having a first recess and a second recess therein, the first recess extending from the lowermost surface along the first edge surface and not reaching the upper surface, the second recess extending from the lowermost surface along the second edge surface and not reaching the upper surface;
a first electrode disposed on the lowermost surface of the resistive element and between the first recess and the second recess;
a second electrode disposed on the lowermost surface of the resistive element and between the first recess and the second recess;
a protective film disposed on the lowermost surface of the resistive element and between the first electrode and the second electrode;
a first plating layer disposed on the first electrode and an inner surface of the first recess; and
a second plating layer disposed on the second electrode and an inner surface of the second recess.

2. The chip resistor of claim 1, wherein
a cross section of the inner surface of the first recess has a portion arcuately concave, and
a cross section of the inner surface of the second recess has a portion arcuately concave.

3. The chip resistor of claim 2, wherein
the portion of the first recess is connected to the first edge surface of the resistive element, and
the portion of the second recess is connected to the second edge surface of the resistive element.

4. The chip resistor of claim 1, wherein
the first electrode has a lower surface, a first edge surface connected to the lower surface of the first electrode, and a second edge surface connected to the lower surface of the first electrode, the first edge surface of the first electrode facing the protective film, the second edge surface being opposite to the first edge surface of the first electrode,
the second electrode has a lower surface, a first edge surface connected to the lower surface of the second electrode, and a second edge surface connected to the lower surface of the second electrode, the first edge surface of the second electrode facing the protective film, the second edge surface of the second electrode being opposite to the first edge surface of the second electrode,
the first plating layer is disposed on the lower surface and the first edge surface of the first electrode and the first edge surface of the resistive element, and
the second plating layer is disposed on the lower surface and the first edge surface of the second electrode and the second edge surface of the resistive element.

5. The chip resistor of claim 4, wherein the protective film contacts the second edge surface of the first electrode and the first edge surface of the second electrode.

6. The chip resistor of claim 4, wherein
the first recess has an inner side surface flush with the first edge surface of the first electrode and a bottom surface connected to the inner side surface of the first recess and the first edge surface of the resistive element, and
the second recess has an inner side surface flush with the second edge surface of the second electrode and a bottom surface connected to the inner side surface of the second recess and the second edge surface of the resistive element.

7. The chip resistor of claim 6, wherein
a cross section of the bottom surface of the first recess has an arcuately concave shape, and
a cross section of the bottom surface of the second recess has an arcuately concave shape.

8. The chip resistor of claim 1, further comprising a fluorine-based coating layer disposed on the upper surface of the resistive element.

9. The chip resistor of claim 8, wherein the fluorine-based coating layer is disposed on the upper surface, the first edge surface, and the second edge surface of the resistive element.

10. A method for manufacturing a chip resistor, comprising:
preparing a layered body including a resistive sheet having a first surface and a second surface opposite to the first surface, a first electrode layer disposed on the first surface of the resistive sheet, a second electrode layer disposed on the first surface of the resistive sheet, and a protective film disposed on the first surface of the resistive sheet and between the first electrode layer and the second electrode layer, the second electrode layer being separated from the first electrode layer;
forming a first groove in the resistive sheet from the first electrode layer of the layered body such that the first groove does not pass through the resistive sheet;
forming a second groove in the resistive sheet from the second electrode layer of the layered body such that the second groove does not pass through the resistive sheet;
forming a first plating layer on a portion of the first electrode layer exposed to the first groove and a portion of the resistive sheet exposed to the first groove;
forming a second plating layer on a portion of the second electrode layer exposed to the second groove and a portion of the resistive sheet exposed to the second groove;
forming a third groove in the second surface of the resistive sheet such that the third groove is connected to the first groove and is narrower than the first groove; and
forming a fourth groove in the second surface of the resistive sheet such that the fourth groove is connected to the second groove and is narrower than the second groove.

11. The method of claim 10, wherein
the first electrode layer has an edge surface facing the protective film and a surface connected to the edge surface of the first electrode layer and the portion of the first electrode layer exposed to the first groove,
said forming the first plating layer comprises forming the first plating layer on the portion of the first electrode layer exposed to the first groove, the portion of the resistive sheet exposed to the first groove, and the surface of the first electrode layer,
the second electrode layer has an edge surface facing the protective film and a surface connected to the edge surface of the second electrode layer and the portion of the second electrode layer exposed to the second groove, and
said forming the second plating layer comprises forming the second plating layer on the portion of the second electrode layer exposed to the second groove, the portion of the resistive sheet exposed to the second groove, and the surface of the second electrode layer.

12. The method of claim 11, wherein the protective film contacts the edge surface of the first electrode layer and the edge surface of the second electrode layer.

13. The method of claim 11, wherein
the first groove passes through the first electrode layer so as to divide the first electrode layer, and
the second groove passes through the second electrode layer so as to divide the second electrode layer.

14. The method of claim 11, wherein
the third groove extends in parallel to the first groove, and
the fourth groove extends in parallel to the second groove.

15. The chip resistor of claim 1, wherein
the first electrode is not disposed in either of the first recess or the second recess, and
the second electrode is not disposed in either of the first recess or the second recess.

16. The chip resistor of claim 1, wherein
the first plating layer has a first surface and a second surface opposite to the first surface of the first plating layer, the first surface of the first plating layer being situated on the resistive element, the second surface of the first plating layer sinking from the first edge surface of the resistive element, and
the second plating layer has a first surface and a second surface opposite to the first surface of the second plating layer, the first surface of the second plating layer being situated on the resistive element, the second surface of the second plating layer sinking from the second edge surface of the resistive element.

17. The chip resistor of claim 1, wherein the lowermost surface of the resistive element forms a single plane.

* * * * *